(12) United States Patent
Kohara

(10) Patent No.: US 9,607,669 B2
(45) Date of Patent: Mar. 28, 2017

(54) SEMICONDUCTOR MEMORY DEVICE INCLUDING PRECHARGE CIRCUIT

(71) Applicant: Kabushiki Kaisha Toshiba, Minato-ku, Tokyo (JP)

(72) Inventor: Koji Kohara, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/932,254

(22) Filed: Nov. 4, 2015

(65) Prior Publication Data

US 2016/0211007 A1    Jul. 21, 2016

(30) Foreign Application Priority Data

Jan. 16, 2015  (JP) .................................. 2015-006998

(51) Int. Cl.
  *G11C 7/00*     (2006.01)
  *G11C 7/12*     (2006.01)
  *G11C 11/419*   (2006.01)

(52) U.S. Cl.
  CPC .............. *G11C 7/12* (2013.01); *G11C 11/419* (2013.01)

(58) Field of Classification Search
  CPC ........................................................ G11C 7/12
  USPC ......................................................... 365/203
  See application file for complete search history.

(56) References Cited

U.S. PATENT DOCUMENTS

| | | | | |
|---|---|---|---|---|
| 6,075,733 A | * | 6/2000 | Brown ...................... | G11C 7/12 365/203 |
| 6,160,746 A | * | 12/2000 | Park ......................... | G11C 7/12 365/203 |
| 6,259,623 B1 | | 7/2001 | Takahashi | |
| 6,333,881 B1 | * | 12/2001 | Kusunoki ................ | G11C 7/12 365/154 |
| 6,603,692 B2 | * | 8/2003 | Hirota ...................... | G11C 8/08 365/189.05 |
| 7,570,527 B2 | * | 8/2009 | Houston ............... | G11C 11/413 365/154 |
| 9,196,353 B2 | * | 11/2015 | Ishii ......................... | G11C 7/12 |
| 2003/0128607 A1 | | 7/2003 | Miyashita et al. | |
| 2004/0109344 A1 | | 6/2004 | Yamauchi | |
| 2006/0158943 A1 | | 7/2006 | Park et al. | |
| 2010/0296354 A1 | | 11/2010 | Kobayashi | |
| 2014/0092672 A1 | * | 4/2014 | Behrends .............. | G11C 11/413 365/154 |
| 2015/0098267 A1 | * | 4/2015 | Jain ......................... | G11C 7/12 365/154 |

(Continued)

*Primary Examiner* — Son Mai
(74) *Attorney, Agent, or Firm* — White & Case LLP

(57) ABSTRACT

According to one embodiment, a semiconductor memory device includes first, second, third and fourth MOS transistors, and first and second precharge circuits. A memory cell includes the first, second, third and fourth MOS transistors. Source and drain of the third MOS transistor are connected to between the source or the drain of the first MOS transistor and a first bit line. Source and drain of the fourth MOS transistor are connected to between the source or the drain of the second MOS transistor and a second bit line. The first precharge circuit supplies a voltage to the first and second bit lines in a precharge period during a read operation or a write operation. The second precharge circuit supplies the voltage to the first and second bit lines while in a data holding state.

20 Claims, 8 Drawing Sheets

(56) References Cited

U.S. PATENT DOCUMENTS

2016/0071578 A1* 3/2016 Ishii ........................ G11C 7/12
365/72

* cited by examiner

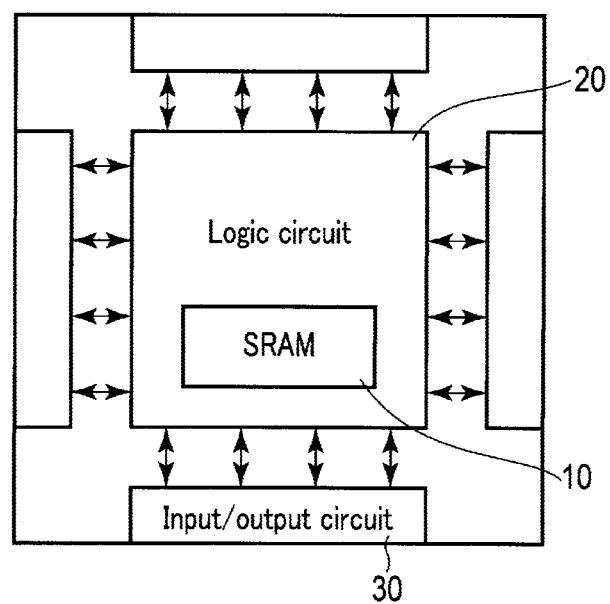
F I G. 1

"1" holding state

"0" holding state

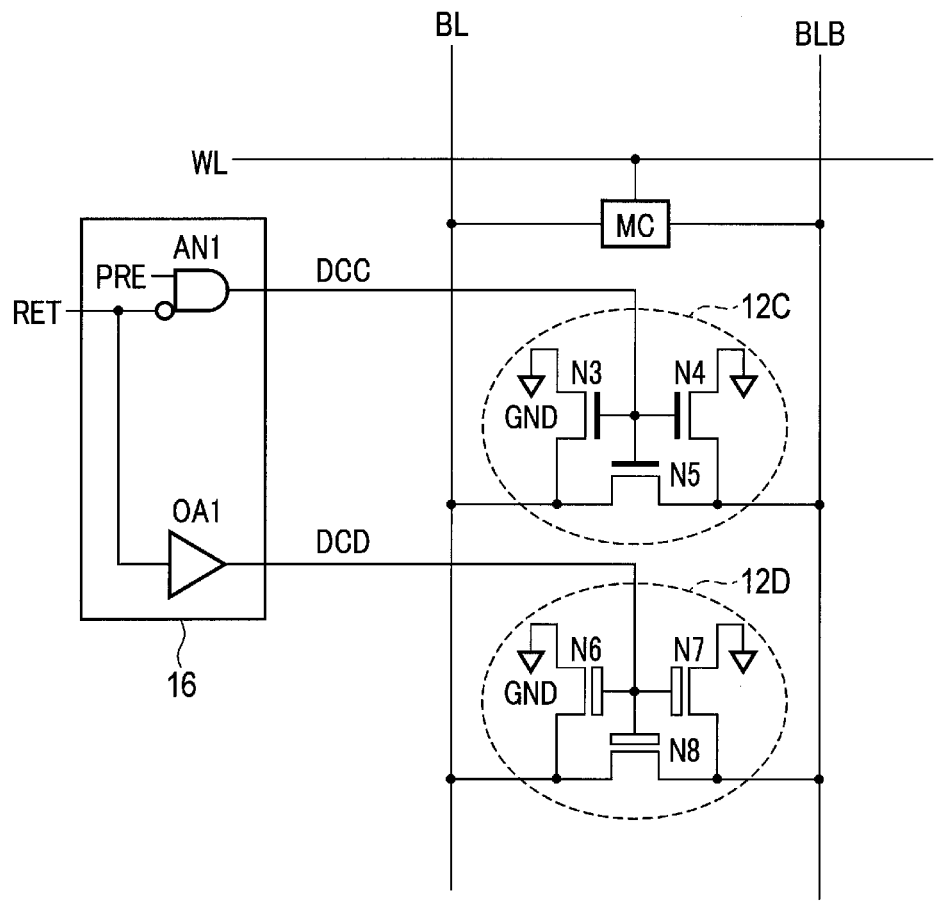
F I G. 12

SEMICONDUCTOR MEMORY DEVICE INCLUDING PRECHARGE CIRCUIT

CROSS-REFERENCE TO RELATED APPLICATIONS

This application is based upon and claims the benefit of priority from the Japanese Patent Application No. 2015-006998, filed Jan. 16, 2015, the entire contents of which are incorporated herein by reference.

FIELD

Embodiments described herein relate generally to a semiconductor memory device.

BACKGROUND

SRAM (static random access memory), which contains a memory cell including four transistors, is known as a semiconductor memory device. Hereinafter, SRAM containing a memory cell of four transistors will be denoted as 4T-SRAM.

In 4T-SRAM, when a memory cell holds data (holding state), a bit line needs to be maintained at an "H" (High) level (hereinafter, denoted as H). A precharge circuit is used to precharge the bit line to "H". The precharge circuit includes a p-channel MOS field effect transistor (hereinafter, denoted as a pMOS transistor). The bit line is maintained, as described above, at "H" in a holding state of data and thus, a power supply voltage ("H") is supplied to the source of a pMOS transistor in the precharge circuit, the voltage "H" of the bit line is supplied to the drain, and an "L" (Low) level (hereinafter, denoted as L) is supplied to the gate. At this point, a gate leak current arises in the pMOS transistor from a channel region between the source and drain to the gate via a gate insulating film.

BRIEF DESCRIPTION OF THE DRAWING

FIG. 1 is a block diagram showing the configuration of a semiconductor integrated circuit on which an SRAM according to an embodiment is mounted;

FIG. 12 is a circuit diagram showing the configuration of a discharge circuit in the SRAM according to the modification.

DETAILED DESCRIPTION

Figure 2:
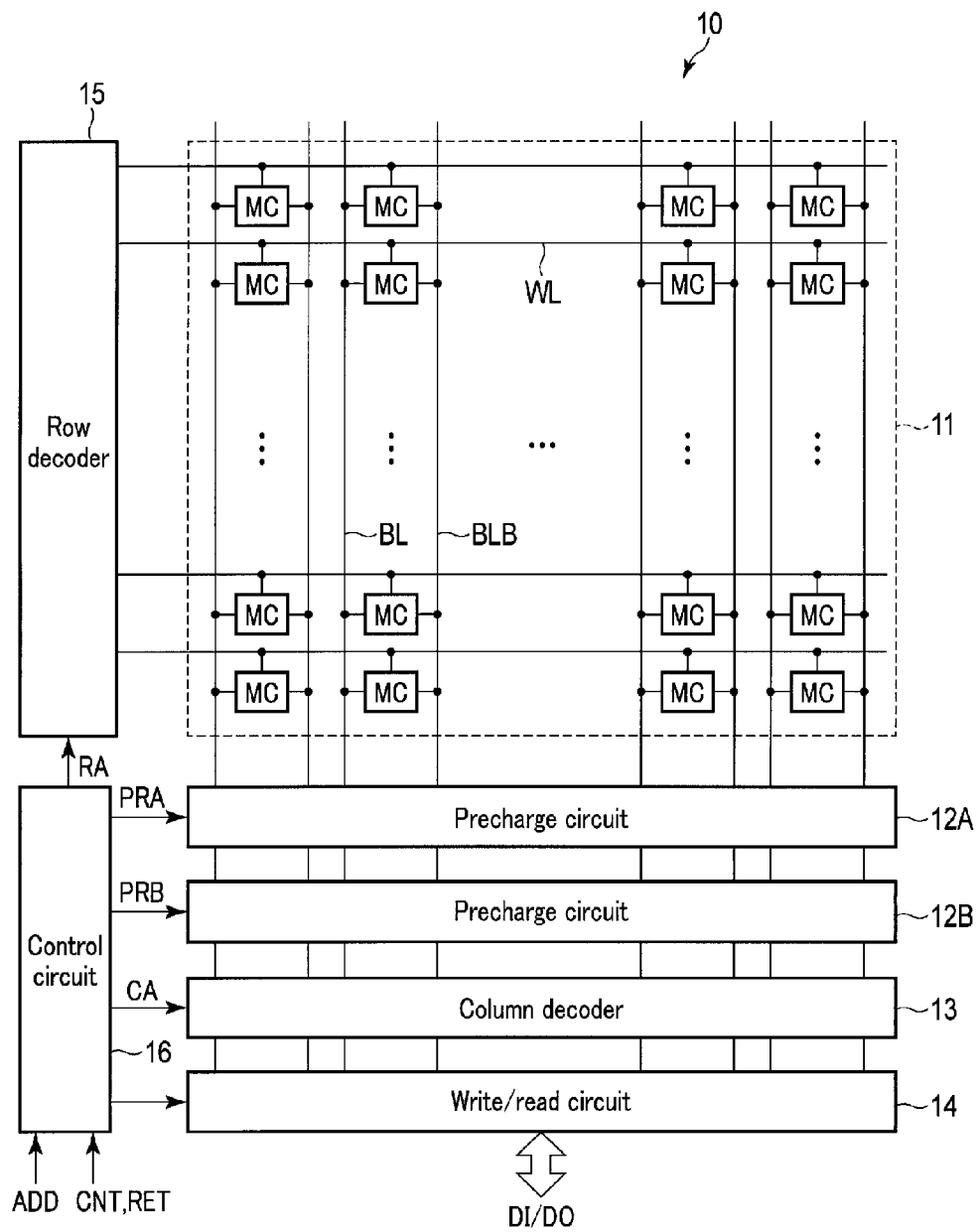
FIG. 2 is a block diagram showing the configuration of the SRAM according to the embodiment.

The embodiment will be described below with reference to the drawings. In the description that follows, the same reference numerals are attached to structural elements having the same function and configuration and a duplicate description will be provided only if necessary. Hereinafter, a semiconductor memory device will be described by taking SRAM as an example.

In general, according to one embodiment, a semiconductor memory device includes first, second, third and fourth MOS transistors, and first and second precharge circuits. The first and second MOS transistors have a first conductive type. The third, fourth and fifth MOS transistors have a second conductive type. A first voltage is supplied to one of a source and a drain of the first MOS transistor. A gate of the second MOS transistor is connected to the other of the source and the drain of the first MOS transistor. The first voltage is supplied to one of a source and a drain of the second MOS transistor and the other of the source and the drain of the second MOS transistor is connected to a gate of the first MOS transistor. Source and drain of the third MOS transistor are connected to between the other of the source and the drain of the first MOS transistor and a first bit line. A gate of the third MOS transistor is connected to a word line. Source and drain of the fourth MOS transistor are connected to between the other of the source and the drain of the second MOS transistor and a second bit line. A gate of the fourth MOS transistor is connected to the word line. The first precharge circuit includes a fifth MOS transistor to supply a second voltage to the first and second bit lines in a precharge period during at least one of a read operation and a write operation. The second precharge circuit includes a sixth MOS transistor to supply the second voltage to the first and second bit lines while in a data holding state.

Embodiment

FIG. 1 is a block diagram showing the configuration of a semiconductor integrated circuit on which an SRAM according to an embodiment is mounted. As shown in FIG. 1, the semiconductor integrated circuit includes an SRAM 10, a logic circuit 20 and an input/output circuit 30.

The SRAM 10 includes a plurality of memory cells arranged in a matrix form. The logic circuit 20 exchanges signals and data between the SRAM 10 and the input/output circuit 30 and performs processing thereof. The input/output circuit 30 inputs/outputs signals and data such as commands and addresses between the SRAM 10 and the logic circuit 20, and an external circuit.

1. Configuration of SRAM

FIG. 2 is a block diagram showing the configuration of the SRAM 10 according to the embodiment. The SRAM 10 includes a memory cell array 11, precharge circuits 12A, 12B, a column decoder 13, a write/read circuit 14, a row decoder 15, and a control circuit 16.

The memory cell array 11 includes a plurality of memory cells MC arranged in a matrix form. A plurality of word lines WL are disposed in the memory cell array 11 such that each of the word lines extends in a row direction. Also, a plurality of bit line pairs BL, BLB are disposed in the memory cell array 11 such that each of the bit line pairs extends in a column direction. The selection of a row of the memory cell array 11 is made by the word line WL. The selection of a column of the memory cell array 11 is made by the bit line pair BL, BLB.

The precharge circuit 12A and the precharge circuit 12B are connected to the bit line pair BL, BLB. The precharge circuit 12A precharges the bit line pair BL, BLB to "H" and maintains the bit line pair BL, BLB at "H" in a holding state (or standby) of data. For example, the precharge circuit 12A performs a precharge operation based on a precharge signal PRA supplied from the control circuit 16. That is, the precharge circuit 12A precharges the bit line pair BL, BLB to "H" when the precharge signal PRA is activated and releases the precharge when the precharge signal PRA is deactivated. Details of the precharge circuit 12A will be described later.

In a read operation or a write operation, the precharge circuit 12B precharges the bit line pair BL, BLB to "H" before or after data is read from or written into the memory cell MC. For example, the precharge circuit 12B performs a precharge operation based on a precharge signal PRB supplied from the control circuit 16. That is, the precharge circuit 12B precharges the bit line pair BL, BLB to "H" when the precharge signal PRB is activated and releases the precharge when the precharge signal PRB is deactivated. Details of the precharge circuit 12B will be described later.

The column decoder 13 is connected to the plurality of bit line pairs BL, BLB. The column decoder 13 decodes a column address signal CA supplied from the control circuit 16 and selects a pair of the bit line pair BL, BLB based on the decode result.

The write/read circuit 14 is connected to the column decoder 13. The write/read circuit 14 writes data to or reads data from the column selected by the column decoder 13. That is, the write/read circuit 14 writes input data DI input from the logic circuit 20 or an external circuit into the memory cell array 11 as write data. The write/read circuit 14 also reads data from the memory cell array 11 and outputs the read data to the logic circuit 20 or the external circuit as output data DO.

The row decoder 15 is connected to the plurality of word lines WL. The row decoder 15 decodes a row address signal RA supplied from the control circuit 16 and selects the word line WL based on the decode result.

The control circuit 16 controls each circuit in the SRAM 10. An address signal ADD and a control signal CNT (including a retention control signal RET) are input into the control circuit 16 from the logic circuit 20 or the external circuit. The control circuit 16 generates the column address signal CA supplied to the column decoder 13 and the row address signal RA supplied to the row decoder 15 based on the address signal ADD. The control circuit 16 also controls the write operation including the precharge operation, the read operation, and the holding state based on, for example, the control signal CNT.

1.1 Configuration of Memory Cell MC

Figure 3:
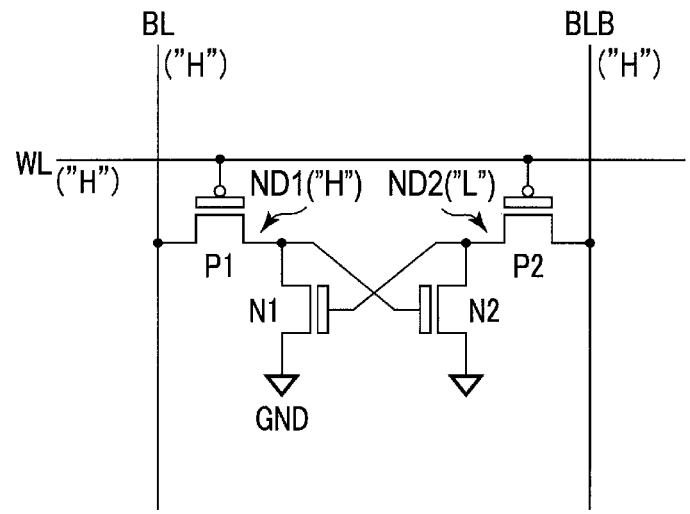
FIGS. 3 and 4 are block diagrams showing the configuration of a memory cell in the SRAM according to the embodiment.
Figure 4:
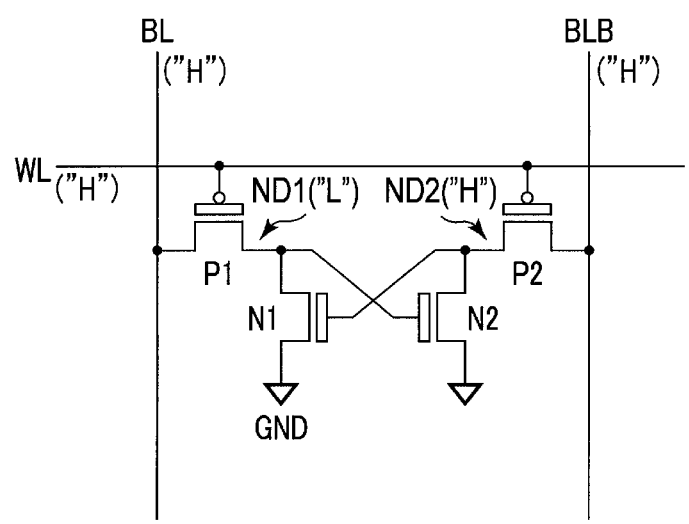

FIGS. 3 and 4 are circuit diagrams showing the configuration of the memory cell MC in the SRAM according to the embodiment. FIG. 3 shows the holding state of "1" data in the memory cell MC and FIG. 4 shows the holding state of '0' data.

The memory cell MC includes n-channel MOS field effect transistors (hereinafter, nMOS transistors) N1, N2 in which the gate and the drain are cross-coupled and p-channel MOS field effect transistors (hereinafter, pMOS transistors) P1, P2 to access a memory cell for reading or writing.

The gate of the nMOS transistor N1 is connected to the drain of the nMOS transistor N2 and the source (or drain) of the pMOS transistor P2. The gate of the nMOS transistor N2 is connected to the drain of the nMOS transistor N1 and the source (or drain) of the pMOS transistor P1. The reference voltage, for example, the ground potential GND ("L") is supplied to the sources of the nMOS transistors N1, N2.

Further, the bit line BL is connected to the drain (or source) of the pMOS transistor P1. The bit line BLB is connected to the drain (or source) of the pMOS transistor P2. The word line WL is connected to the gates of the pMOS transistors P1, P2.

The connecting point of the gate of the nMOS transistor N2, the drain of the nMOS transistor N1, and the source (or drain) of the pMOS transistor P1 is denoted as a node ND1. The connecting point of the gate of the nMOS transistor N1, the drain of the nMOS transistor N2, and the source (or drain) of the pMOS transistor P2 is denoted as a node ND2.

The memory cell MC stores data of "1" or "0" by holding "H" or "L" in the node ND1 and the node ND2. Data complementary to each other is stored in the nodes ND1, ND2.

In the holding state of "1" data, as shown in FIG. 3, "H" is held in the node ND1 and "L" is held in the node ND2. On the other hand, in the holding state of "0" data, as shown in FIG. 4, "L" is held in the node ND1 and "H" is held in the node ND2. Further, in these holding states, "H" is supplied to the word line WL and the bit line pair BL, BLB are precharged to "H".

In the present embodiment, for example, the thicknesses of the gate insulating films of the pMOS transistors P1, P2 and the nMOS transistors N1, N2 included in the memory cell MC are thicker than the thicknesses of the gate insulating films of MOS transistors included in the logic circuit 20 or the precharge circuit 12A. Accordingly, a gate leak current arising in the MOS transistors in the memory cell MC can be reduced. The gate insulating film is formed of, for example, silicon oxide. Here, an example in which the thicknesses of the gate insulating films of the MOS transistors P1, P2, N1, N2 included in the memory cell MC are thicker than the thicknesses of the gate insulating films of the MOS transistors included in the logic circuit 20 or the precharge circuit 12A is shown, but these transistors may have gate insulating films of the same thickness.

1.2 Configuration of Precharge Circuit

Figure 5:
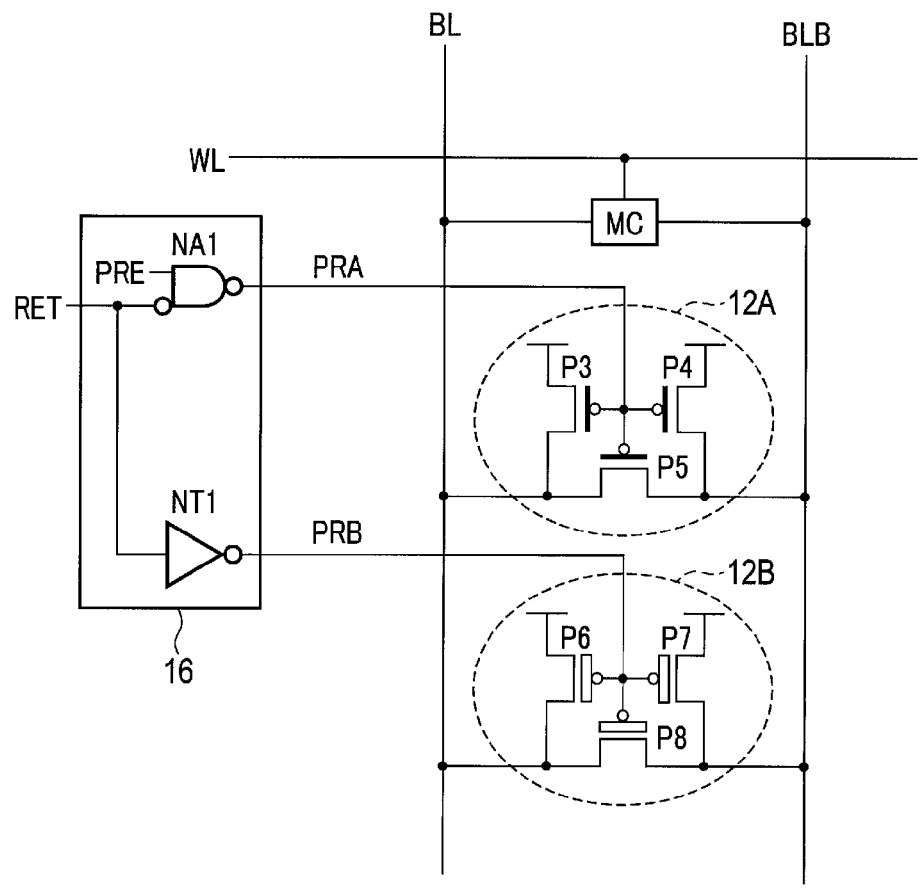
FIG. 5 is a circuit diagram showing the configuration of a precharge circuit in the SRAM according to the embodiment.

FIG. 5 is a circuit diagram showing the configuration of a precharge circuit according to the embodiment. As shown in FIGS. 3 and 4, the memory cell MC is connected to an intersection portion of the bit line pair BL, BLB and the word line WL. The two precharge circuits 12A, 12B are connected to between the bit line pair BL, BLB.

The control circuit 16 includes a NAND circuit NA1 and a NOT circuit NT1. The output terminal of the NAND circuit NA1 is connected to the precharge circuit 12A and the NAND circuit NA1 outputs the signal PRA to the precharge circuit 12A. The output terminal of the NOT circuit NT1 is connected to the precharge circuit 12B and the NOT circuit NT1 outputs the signal PRB to the precharge circuit 12B.

The precharge circuit 12A includes pMOS transistors P3, P4, P5. The drain of the pMOS transistor P3 is connected to the source (or drain) of the pMOS transistor P5 and the bit line BL. The drain of the pMOS transistor P4 is connected to the drain (or source) of the pMOS transistor P5 and the bit line BLB. A power supply voltage VDD ("H") is supplied to the sources of the pMOS transistors P3, P4.

The signal PRA from the NAND circuit NA1 is supplied to the gates of the pMOS transistors P3, P4, P5. The precharge signal PRA is a signal that sets the precharge circuit 12A to an operating state or a non-operating state. When the precharge signal PRA is "L", the precharge circuit 12A is set to the operating state to precharge the bit lines BL, BLB to "H". When the precharge signal PRA is "H", the precharge circuit 12A is set to the non-operating state and does not precharge the bit lines BL, BLB. The operating state is a state in which the pMOS transistors in the precharge circuit are in an ON state and the non-operating state is a state in which the pMOS transistors in the precharge circuit are in an OFF state.

The precharge circuit 12B includes pMOS transistors P6, P7, P8. The drain of the pMOS transistor P6 is connected to the source (or drain) of the pMOS transistor P8 and the bit line BL. The drain of the pMOS transistor P7 is connected to the drain (or source) of the pMOS transistor P8 and the bit line BLB. The power supply voltage VDD ("H") is supplied to the sources of the pMOS transistors P6, P7.

The precharge signal PRB from the NOT circuit NT1 is supplied to the gates of the pMOS transistors P6, P7, P8. The precharge signal PRB is a signal that sets the precharge circuit 12B to the operating state or the non-operating state. When the precharge signal PRB is "L", the precharge circuit 12B is set to the operating state to precharge the bit lines BL, BLB to "H". When the precharge signal PRB is "H", the precharge circuit 12B is set to the non-operating state and does not precharge the bit lines BL, BLB.

In the present embodiment, the precharge circuit 12A is used for the read operation or the write operation and the precharge circuit 12B is used while in the data holding state. The read operation or write operation and the data holding state will be described later.

In the description that follows, the thickness of the gate insulating film of each of the pMOS transistors P3, P4, P5 included in the precharge circuit 12A is denoted as a "first gate film thickness" and the thickness of the gate insulating film of each of the pMOS transistors P6, P7, P8 included in the precharge circuit 12B is denoted as a "second gate film thickness". Also, the channel width of each of the pMOS transistors P3, P4, P5 included in the precharge circuit 12A is denoted as a "first channel width" and the channel width of each of the pMOS transistors P6, P7, P8 included in the precharge circuit 12B is denoted as a "second channel width".

In the present embodiment, the first gate film thickness of the pMOS transistors P3, P4, P5 in the precharge circuit 12A is thin and the second gate film thickness of the pMOS transistors P6, P7, P8 in the precharge circuit 12B is thicker than the first gate film thickness. Accordingly, a gate leak current arising in the pMOS transistors P6, P7, P8 in the precharge circuit 12B can be made smaller than a gate leak current arising in the pMOS transistors P3, P4, P5 in the precharge circuit 12A. Incidentally, the gate insulating film is formed of, for example, silicon oxide, silicon nitride, or a film having a high dielectric constant (High-k film).

The second channel width of the pMOS transistors P6, P7, P8 in the precharge circuit 12B is smaller than the first channel width of the pMOS transistors P3, P4, P5 in the precharge circuit 12A.

Here, an example in which each of the precharge circuits 12A, 12B includes three pMOS transistors is shown. However, the embodiment is not limited to such an example and each of the precharge circuits 12A, 12B may include two pMOS transistors. In this case, the pMOS transistors P5, P8 may be deleted from the precharge circuits 12A, 12B shown in FIG. 5.

2. Operation of SRAM

Next, the read operation of data, the write operation and the data holding state in the SRAM 10 will be described. These operations are performed in response to instructions of, for example, the control circuit 16. That is, the column decoder 13 and the row decoder 15 transfer various voltages to the word line WL or the bit lines BL, BLB at a predetermined timing according to instructions of the control circuit 16. Also, the precharge circuit 12A operates to perform a precharge operation in the read operation or the write operation and the precharge circuit 12B operates in the data holding state according to instructions of the control circuit 16.

2.1 Read Operation

Figure 6:
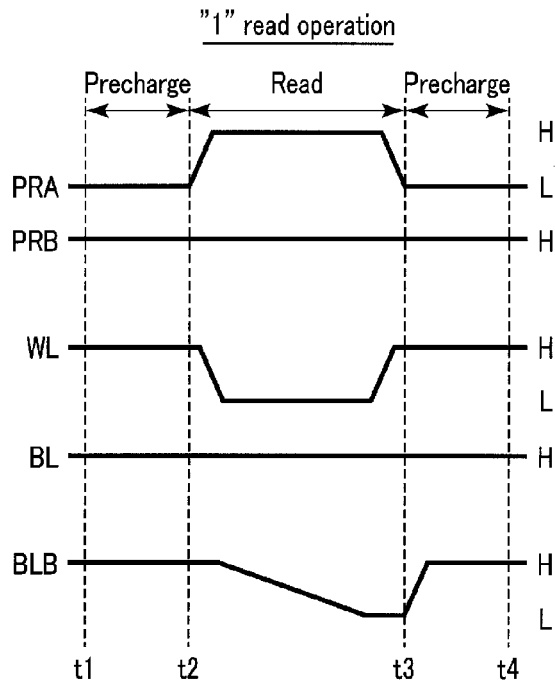
FIG. 6 is a timing chart showing a read operation of "1" data in the SRAM according to the embodiment.

FIG. 6 is a timing chart showing the read operation of "1" data in the SRAM 10. The read operation of "1" data is an operation to read "L" from a state in which "H" is held in the node ND1 of the memory cell MC shown in FIG. 3 and "L" is held in the node ND2 into the bit line BLB. In FIG. 6, the bit line is precharged at time t1-t2, data is read at time t2-t3, and further, the bit line is precharged at time t3-t4 in preparation for the next read.

First, the precharge at time t1-t2 operates as described below.

A precharge control signal PRE is generated based on the control signal CNT in the control circuit 16. Also, a retention control signal RET is input into the control circuit 16 from an external circuit.

"H" is input into a first input terminal of the NAND circuit NA1 as the precharge control signal PRE and "H" after "L" being reversed is input into a second input terminal as the retention control signal RET. Accordingly, "L" is output from the output terminal of the NAND circuit NA1 as the precharge signal PRA. When "L" is received as the precharge signal PRA at time t1-t2, the precharge circuit 12A is set to the operating state to precharge the bit lines BL, BLB to "H". That is, "L" is input into the gates of the pMOS transistors P3, P4, P5 in the precharge circuit 12A and the pMOS transistors P3, P4, P5 are turned on. Accordingly, the power supply voltage VDD ("H") is supplied to the bit lines BL, BLB to precharge the bit lines BL, BLB to "H".

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t1-t2, the precharge circuit 12B is set to the non-operating state and does not precharge the bit lines BL, BLB. That is, "H" is input into the gates of the pMOS transistors P6, P7, P8 in the precharge circuit 12B and the pMOS transistors P6, P7, P8 are turned off. Accordingly, the power supply voltage VDD is not supplied to the bit lines BL, BLB and the bit lines BL, BLB are not precharged to "H".

At time t1-t2, the word line WL is changed to "H" and the pMOS transistors P1, P2 are turned off. Thus, "H" or "L" held in the nodes ND1, ND2 is not transferred to the bit lines BL, BLB.

Next, data reading at time t2-t3 operates as described below.

The control circuit 16 outputs "L" as the precharge control signal PRE. Accordingly, "H" is output from the output terminal of the NAND circuit NA1 as the precharge signal PRA. When "H" is received as the precharge signal PRA at time t2-t3, the precharge circuit 12A is set to the non-operating state to stop the precharge of the bit lines BL, BLB.

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t2-t3, the precharge circuit 12B is set to the non-operating state and does not precharge the bit lines BL, BLB.

Further at time t2-t3, the word line WL is changed to "L" and the pMOS transistors P1, P2 are turned on. Then, "L" held in the node ND2 is transferred to the bit line BLB. "H" is held in the node ND1 and thus, the potential of the bit line BL is maintained at "H". The read circuit 14 reads data stored in the memory cell MC by differentially amplifying potentials of the bit line BL and the bit line BLB. Here, the potential of the bit line BLB is lower than the potential of the bit line BL and the read circuit 14 reads "1" data.

Next, the precharge at time t3-t4 operates as described below.

At time t3-t4, the word line WL is changed to "H" and the pMOS transistors P1, P2 are turned off. Accordingly, the transfer of "H" or "L" held in the nodes ND1, ND2 is stopped. Further, when "L" is received as the precharge signal PRA, the precharge circuit 12A is set to the operating state to precharge the bit lines BL, BLB to "H". When "H" is received as the precharge signal PRB, the precharge circuit 12B is set to the non-operating state and does not precharge the bit lines BL, BLB.

In the read operation of "1" data, as described above, the precharge circuit 12A is set to the operating state at time t1-t2 and t3-t4 and the precharge circuit 12B is set to the non-operating state at time t1-t4 (during read operation). The thickness (first gate film thickness) of the gate insulating film of each of the pMOS transistors in the precharge circuit 12A is thin and the thickness (second gate film thickness) of the gate insulating film of each of the pMOS transistors in the precharge circuit 12B is thicker than the first gate film thickness. Thus, when the same voltage is applied to the gates of these transistors, the current driving capacity of the precharge circuit 12A is larger than that of the precharge circuit 12B. In the read operation, therefore, data can be read without the reading speed being reduced by putting the precharge circuit 12A into the operating state.

Figure 7:
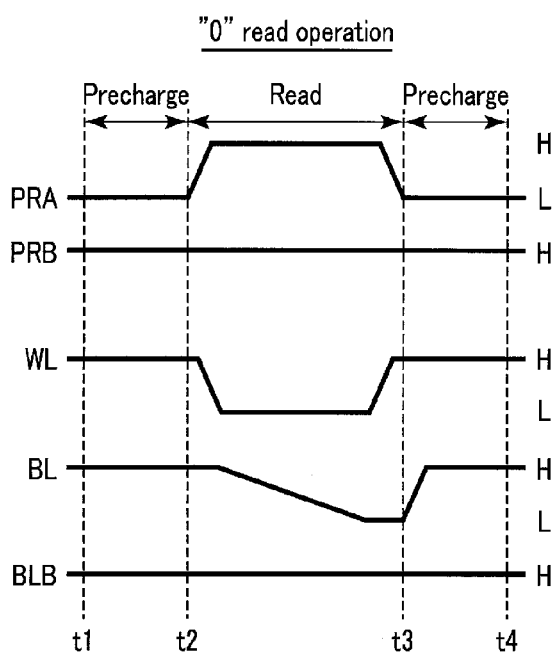
FIG. 7 is a timing chart showing the read operation of "0" data in the SRAM according to the embodiment.

FIG. 7 is a timing chart showing the read operation of "0" data in the SRAM 10. The read operation of "0" data is an operation to read "L" from a state in which "L" is held in the node ND1 of the memory cell MC shown in FIG. 4 and "H" is held in the node ND2 into the bit line BL. In FIG. 7, the bit line is precharged at time t1-t2, data is read at time t2-t3, and further, the bit line is precharged at time t3-t4 in preparation for the next read.

First, the precharge at time t1-t2 operates as described below.

The control circuit 16 outputs "H" as the precharge control signal PRE and "L" as the retention control signal RET. Accordingly, "H" is input into the first input terminal of the NAND circuit NA1 and "H" after "L" being reversed is input into the second input terminal. Accordingly, "L" is output from the output terminal of the NAND circuit NA1 as the precharge signal PRA. When "L" is received as the precharge signal PRA at time t1-t2, the precharge circuit 12A is set to the operating state to precharge the bit lines BL, BLB to "H".

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t1-t2, the precharge circuit 12B is set to the non-operating state and does not precharge the bit lines BL, BLB.

At time t1-t2, the word line WL is changed to "H" and the pMOS transistors P1, P2 are turned off. Thus, "H" or "L" held in the nodes ND1, ND2 is not transferred to the bit lines BL, BLB.

Next, data reading at time t2-t3 operates as described below.

The control circuit 16 outputs "L" as the precharge control signal PRE. Accordingly, "H" is output from the output terminal of the NAND circuit NA1 as the precharge signal PRA. When "H" is received as the precharge signal PRA at time t2-t3, the precharge circuit 12A is set to the non-operating state to stop the precharge of the bit lines BL, BLB.

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t2-t3, the precharge circuit 12B is set to the non-operating state and does not precharge the bit lines BL, BLB.

Further at time t2-t3, the word line WL is changed to "L" and the pMOS transistors P1, P2 are turned on. Then, "L" held in the node ND1 is transferred to the bit line BL. The potential of the bit line BLB is maintained at "H" because "H" is held in the node ND2. The read circuit 14 compares the potential of the bit line BL and that of the bit line BLB to read data stored in the memory cell MC. Here, the potential of the bit line BL is lower than that of the bit line BLB and thus, the read circuit 14 reads "0" data.

Next, the precharge at time t3-t4 operates as described below.

At time t3-t4, the word line WL is changed to "H" and the pMOS transistors P1, P2 are turned off. Accordingly, the transfer of "L" or "H" held in the nodes ND1, ND2 is stopped. Further, when "L" is received as the precharge signal PRA, the precharge circuit 12A is set to the operating state to precharge the bit lines BL, BLB to "H". When "H" is received as the precharge signal PRB, the precharge circuit 12B is set to the non-operating state and does not precharge the bit lines BL, BLB.

As described above, in the read operation of "0" data, like the read operation of "1" data, the precharge circuit 12A is set to the operating state at time t1-t2 and time t3-t4 and the precharge circuit 12B is set to the non-operating state at time t1-t4 (during write operation). The first gate film thickness of each of the pMOS transistors in the precharge circuit 12A is thin and the second gate film thickness of each of the pMOS transistor in the precharge circuit 12B is thicker than the first gate film thickness. Thus, when the same voltage is applied to the gates of these transistors, the current driving capacity of the precharge circuit 12A is larger than that of the precharge circuit 12B. In the read operation, therefore, data can be read without the reading speed being reduced by putting the precharge circuit 12A into the operating state.

2.2 Write Operation

Figure 8:
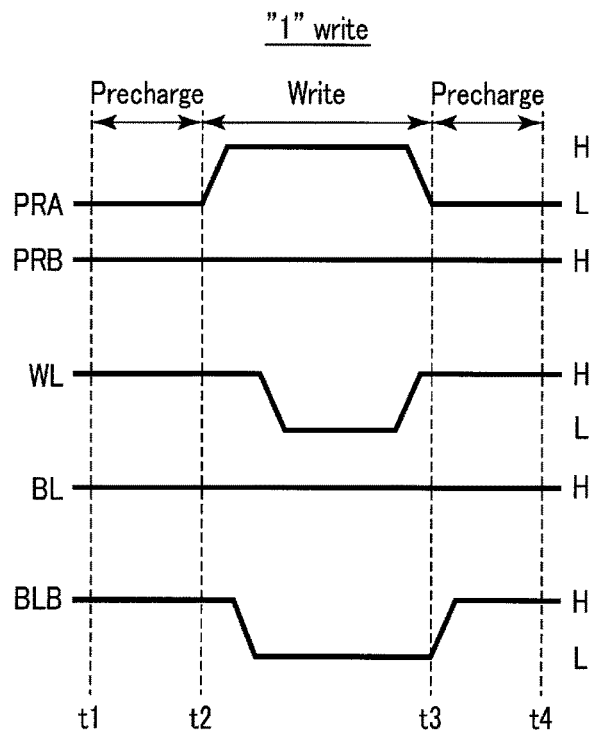
FIG. 8 is a timing chart showing a write operation of "1" data in the SRAM according to the embodiment.

FIG. 8 is a timing chart showing a write operation of "1" data in the SRAM 10. The write operation of "1" data is, as shown in FIG. 3, an operation to write into a state in which "H" is held in the node ND1 of the memory cell MC and "L" is held in the node ND2. In FIG. 8, the bit line is precharged at time t1-t2, data is written at time t2-t3, and further, the bit line is precharged in preparation for the next write at time t3-t4.

First, the precharge at time t1-t2 operates as described below.

The control circuit 16 outputs "H" as the precharge control signal PRE and "L" as the retention control signal RET. Accordingly, "H" is input into the first input terminal of the NAND circuit NA1 and "H" after "L" being reversed is input into the second input terminal. Accordingly, "L" is output from the output terminal of the NAND circuit NA1 as the precharge signal PRA. When "L" is received as the precharge signal PRA at time t1-t2, the precharge circuit 12A is set to the operating state to precharge the bit lines BL, BLB to "H".

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t1-t2, the precharge circuit 12B is set to the non-operating state and does not precharge the bit lines BL, BLB.

At time t1-t2, the word line WL is changed to "H" and the pMOS transistors P1, P2 are turned off. Thus, the transfer of potentials from the bit lines BL, BLB to the nodes ND1, ND2 is stopped.

Next, data writing at time t2-t3 operates as described below.

The control circuit 16 outputs "L" as the precharge control signal PRE. Accordingly, "H" is output from the output terminal of the NAND circuit NA1 as the precharge signal PRA. When "H" is received as the precharge signal PRA at time t2-t3, the precharge circuit 12A is set to the non-operating state to stop the precharge of the bit lines BL, BLB.

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t2-t3, the precharge circuit 12B is set to the non-operating state and does not precharge the bit lines BL, BLB.

Next, at time t2-t3, the write circuit 14 applies "L" to one of the bit lines BL, BLB in accordance with write data and "H" to the other. Here, "L" is applied to the bit line BLB and "H" to the bit line BL to write "1" data.

Further, the word line WL is changed to "L" and the pMOS transistors P1, P2 are turned on. Then, the potential "L" of the bit line BLB is transferred to the node ND2. Also, the potential "H" of the bit line BL is transferred to the node ND1. Accordingly, "1" data is stored in the memory cell MC.

Next, the precharge at time t3-t4 operates as described below.

At time t3-t4, the word line WL is changed to "H" and the pMOS transistors P1, P2 are turned off. Accordingly, the transfer of potentials from the bit lines BL, BLB to the nodes ND1, ND2 is stopped. Further, when "L" is received as the precharge signal PRA, the precharge circuit 12A is set to the operating state to precharge the bit lines BL, BLB to "H". When "H" is received as the precharge signal PRB, the precharge circuit 12B is set to the non-operating state and does not precharge the bit lines BL, BLB.

In the write operation of "1" data, as described above, the precharge circuit 12A is set to the operating state at time t1-t2 and time t3-t4 and the precharge circuit 12B is set to the non-operating state at time t1-t4 (during write operation). The first gate film thickness of each of the pMOS transistors in the precharge circuit 12A is thin and the second gate film thickness of each of the pMOS transistors in the precharge circuit 12B is thicker than the first gate film thickness. Thus, when the same voltage is applied to the gates of these transistors, the current driving capacity of the precharge circuit 12A is larger than that of the precharge circuit 12B. In the write operation, therefore, data can be written without the writing speed being reduced by putting the precharge circuit 12A into the operating state.

Figure 9:
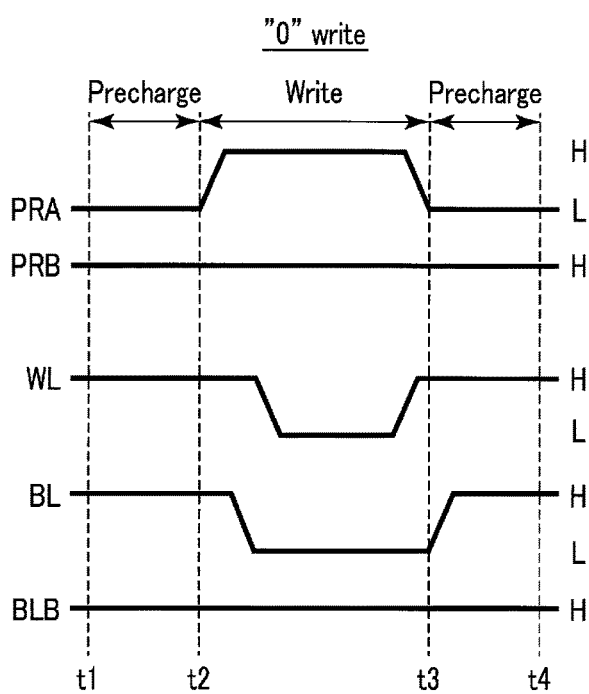
FIG. 9 is a timing chart showing the write operation of "0" data in the SRAM according to the embodiment.

FIG. 9 is a timing chart showing the write operation of "0" data in the SRAM 10. The write operation of "0" data is, as shown in FIG. 4, an operation to write into a state in which "L" is held in the node ND1 of the memory cell MC and "H" is held in the node ND2. In FIG. 9, the bit line is precharged at time t1-t2, data is written at time t2-t3, and further, the bit line is precharged in preparation for the next write at time t3-t4.

First, the precharge at time t1-t2 operates as described below.

The control circuit 16 outputs "H" as the precharge control signal PRE and "L" as the retention control signal RET. Accordingly, "H" is input into the first input terminal of the NAND circuit NA1 and "H" after "L" being reversed is input into the second input terminal. Accordingly, "L" is output from the output terminal of the NAND circuit NA1 as the precharge signal PRA. When "L" is received as the precharge signal PRA at time t1-t2, the precharge circuit 12A is set to the operating state to precharge the bit lines BL, BLB to "H".

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t1-t2, the precharge circuit 12B is set to the non-operating state and does not precharge the bit lines BL, BLB.

At time t1-t2, the word line WL is changed to "H" and the pMOS transistors P1, P2 are turned off. Thus, the transfer of potentials from the bit lines BL, BLB to the nodes ND1, ND2 is stopped.

Next, data writing at time t2-t3 operates as described below.

The control circuit 16 outputs "L" as the precharge control signal PRE. Accordingly, "H" is output from the output terminal of the NAND circuit NA1 as the precharge signal PRA. When "H" is received as the precharge signal PRA at time t2-t3, the precharge circuit 12A is set to the non-operating state to stop the precharge of the bit lines BL, BLB.

As described above, the control circuit 16 outputs "L" as the retention control signal RET. Accordingly, "L" is input into the input terminal of the NOT circuit NT1 and "H" is output from the output terminal as the precharge signal PRB. When "H" is received as the precharge signal PRB at time t2-t3, the precharge circuit 12B is set to the non-operating state and does not precharge the bit lines BL, BLB.

Next, at time t2-t3, the write circuit 14 applies "L" to one of the bit lines BL, BLB in accordance with write data and "H" to the other. Here, "L" is applied to the bit line BL and "H" is applied to the bit line BLB to write "0" data.

Further, the word line WL is changed to "L" and the pMOS transistors P1, P2 are turned on. Then, the potential "L" of the bit line BL is transferred to the node ND1. Also, the potential "H" of the bit line BLB is transferred to the node ND2. Accordingly, "0" data is stored in the memory cell MC.

Next, the precharge at time t3-t4 operates as described below.

At time t3-t4, the word line WL is changed to "H" and the pMOS transistors P1, P2 are turned off. Accordingly, the transfer of potentials from the bit lines BL, BLB to the nodes ND1, ND2 is stopped. Further, when "L" is received as the precharge signal PRA, the precharge circuit 12A is set to the operating state to precharge the bit lines BL, BLB to "H". When "H" is received as the precharge signal PRB, the precharge circuit 12B is set to the non-operating state and does not precharge the bit lines BL, BLB.

In the write operation of "0" data, as described above, the precharge circuit 12A is set to the operating state at time t1-t2 and time t3-t4 and the precharge circuit 12B is set to the non-operating state at time t1-t4 (during write operation). The first gate film thickness of each of the pMOS transistors in the precharge circuit 12A is thin and the second gate film thickness of each of the pMOS transistors in the precharge circuit 12B is thicker than the first gate film thickness. Thus, when the same voltage is applied to the gates of these transistors, the current driving capacity of the precharge circuit 12A is larger than that of the precharge circuit 12B. In the write operation, therefore, data can be written without the writing speed being reduced by putting the precharge circuit 12A into the operating state.

Incidentally, the precharge circuit 12B can also be used to precharge the bit lines BL, BLB in the aforementioned read operation or write operation. If the precharge circuit 12B is used together with the precharge circuit 12A to precharge the bit line in the read operation or write operation, the precharge operation can be performed faster so that the read operation or the write operation can be performed faster.

2.3 Data Holding State

Figure 10:
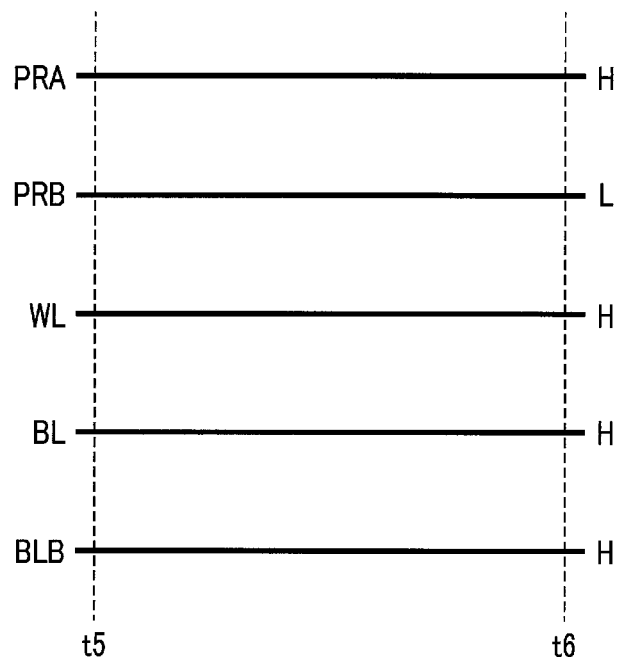
FIG. 10 is a timing chart showing a data holding state in the SRAM according to the embodiment.

FIG. 10 is a timing chart showing a data holding state in the SRAM 10. The data holding state is, as shown in FIGS. 3 and 4, an operation to hold "H" or "L" in the nodes ND1, ND2.

As shown in FIG. 10, the control circuit 16 outputs "L" as the precharge control signal PRE and "H" as the retention control signal RET. Accordingly, "L" is input into the first input terminal of the NAND circuit NA1 and "L" after "H" being reversed is input into the second input terminal. Accordingly, "H" is output from the output terminal of the NAND circuit NA1 as the precharge signal PRA. When "H" is received as the precharge signal PRA at time t5-t6, the precharge circuit 12A is set to the non-operating state and does not precharge the bit lines BL, BLB.

Also, as described above, the control circuit 16 outputs "H" as the retention control signal RET. Accordingly, "H" is input into the input terminal of the NOT circuit NT1 and "L" is output from the output terminal as the precharge signal PRB. When "L" is received as the precharge signal PRB at time t5-t6, the precharge circuit 12B is set to the operating state to precharge the bit lines BL, BLB to "H".

In the data holding state, as described above, the precharge circuit 12A is set to the non-operating state and the precharge circuit 12B is set to the operating state at time t5-t6. The first gate film thickness of each of the pMOS transistors in the precharge circuit 12A is thin and the second gate film thickness of each of the pMOS transistors in the precharge circuit 12B is thicker than the first gate film thickness. Thus, a gate leak current arising in the pMOS transistors in the precharge circuit 12B is smaller than a gate leak current arising in the pMOS transistors in the precharge circuit 12A. In the present embodiment, therefore, the leak current arising in the precharge circuits can be reduced by putting the precharge circuit 12B into the operating state and the precharge circuit 12A into the non-operating state while in the data holding state.

3. Effect

In the present embodiment, the leak current arising in the precharge circuits can be reduced by putting the precharge circuit 12A into the non-operating state and the precharge circuit 12B into the operating state in the data holding state.

The thickness (first gate film thickness) of the gate insulating film of each of the pMOS transistors in the precharge circuit 12A is thin and the thickness (second gate film thickness) of the gate insulating film of each of the pMOS transistors in the precharge circuit 12B is thicker than the first gate film thickness. Thus, the gate leak current arising in the gate insulating film of each of the pMOS transistors in the precharge circuit 12B is smaller than the gate leak current arising in the gate insulating film of each of the pMOS transistors in the precharge circuit 12A. In the present embodiment, therefore, the leak current arising in the precharge circuits in the precharge operation while in the data holding state can be reduced by putting the precharge circuit 12A into the non-operating state and the precharge circuit 12B into the operating state in the data holding state. If, for example, the precharge circuit 12A is used in the data holding state, the leak current arising in the precharge circuit 12A increases, but in the present embodiment, the precharge circuit 12B is used and thus, when compared with a case in which the precharge circuit 12A is used, the leak current arising in the precharge circuit 12B can be reduced.

In the present embodiment, the second channel width of each of the pMOS transistors in the precharge circuit 12B is smaller than the first channel width of each of the pMOS transistors in the precharge circuit 12A. The bit lines BL, BLB are precharged to "H" in the data holding state, but the bit lines need only to be maintained at "H", that is, there is no need of an operation such as precharging a bit line of "L" to "H" and thus, the current driving capacity of a pMOS transistor in the precharge circuit 12B may be small. Therefore, the second channel width may be shorter than the first channel width. Accordingly, the area needed to provide the precharge circuit 12B may be made smaller. When there is no need to make the arrangement area of the precharge circuit 12B smaller, the second channel may be the same as the first channel width or longer than the first channel width.

Also in the present embodiment, the precharge circuit 12A is set to the operating state and the precharge circuit 12B is set to the non-operating state for the read operation or the write operation. In the read operation or the write operation, by performing the precharge using the precharge circuit 12A including the pMOS transistors having thin gate insulating films, the read operation or the write operation can be performed without the operating speed of the precharge being reduced.

Also in the above embodiment, the precharge circuit 12B is set to the non-operating state for the read operation or the write operation, but the precharge circuit 12A and the precharge circuit 12B may both be set to the operating state. If the two precharge circuits 12A, 12B are set to the operating state, the bit lines can be precharged faster so that the read operation or the write operation can be performed faster.

The input/output circuit 30 shown in FIG. 1 includes a plurality of nMOS transistors and pMOS transistors. These nMOS transistors and pMOS transistors are MOS transistors having a thicker gate insulating film than MOS transistors included in the precharge circuit 12A or the logic circuit 20. Also, as described above, the MOS transistors included in the precharge circuit 12B are the MOS transistors having a thick gate insulating film. Thus, the MOS transistors included in the precharge circuit 12B and the input/output circuit 30 are set to have gate insulating films of the same thickness. In this case, the MOS transistors included in the precharge circuit 12B and the input/output circuit 30 can be formed by the same manufacturing process using the same material. Accordingly, the manufacturing process of semiconductor memory devices according to the present embodiment can be simplified.

According to the present embodiment, as described above, the semiconductor memory device capable of reducing the leak current in the precharge circuit while in the data holding state can be provided.

[Modification and the Like]

The present embodiment can also be applied to SRAM having a state holding a bit line pair at "H" while in a data holding state.

Also in the present embodiment, a memory cell holding "H" or "L" for each gate of the nMOS transistors is used in two nMOS transistors in which the gate and the drain are cross-coupled, but the present embodiment is not limited to such an example and a memory cell having two pMOS transistors in which the gate and the drain are cross-coupled may also be used. SRAM using a memory cell of the two pMOS transistors will be called a modification below.

Figure 11:
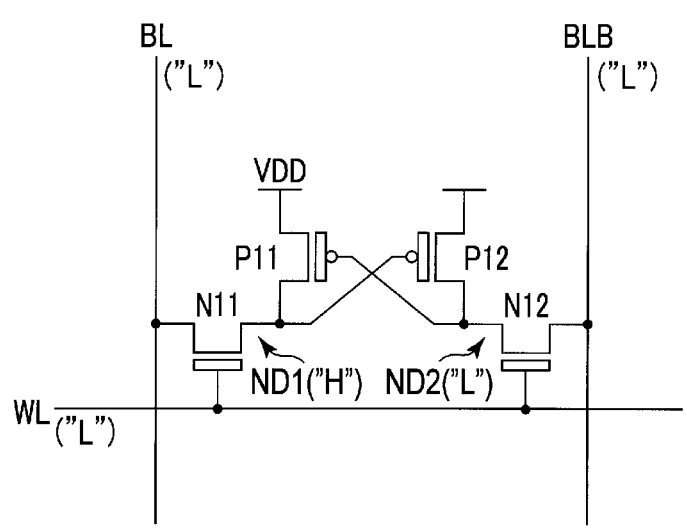
FIG. 11 is a circuit diagram showing the configuration of the memory cell in an SRAM according to a modification.

FIG. 11 shows a state in which a memory cell according to the modification holds "1" data. The memory cell includes pMOS transistors P11, P12 in which the gate and the drain are cross-coupled and nMOS transistors N11, N12 to access a memory cell for reading or writing.

The gate of the pMOS transistor P11 is connected to the drain of the pMOS transistor P12 and the drain (or source) of the nMOS transistor N12. The gate of the pMOS transistor P12 is connected to the drain of the pMOS transistor P11 and the drain (or source) of the nMOS transistor N11. The power supply voltage VDD ("H") is supplied to the sources of the pMOS transistors P11, P12.

Further, the bit line BL is connected to the source (or drain) of the nMOS transistor N11. The bit line BLB is connected to the source (or drain) of the nMOS transistor N12. The word line WL is connected to the gates of the nMOS transistors N11, N12. In a holding state of "1" data, as shown in FIG. 11, "H" is held in the node ND1 and "L" is held in the node ND2. On the other hand, in a holding state of "0" data, though not shown, "L" is held in the node ND1 and "H" is held in the node ND2. In these data holding states, "L" is supplied to the word line WL and the bit line pair BL, BLB is held at "L".

In the modification, instead of the precharge circuit, a discharge circuit is used to hold the bit line pair BL, BLB at "L".

FIG. 12 is a circuit diagram showing the configuration of the discharge circuit according to the modification. Here, only locations that are different from those of the configuration shown in FIG. 5 will be described. Two discharge circuits 12C, 12D are connected to between the bit line pair BL, BLB.

The control circuit 16 includes an AND circuit AN1 and an amplifier circuit OA1. The AND circuit AN1 outputs a discharge signal DCC to the discharge circuit 12C. The amplifier circuit OA1 outputs a discharge signal DCD to the discharge circuit 12D.

The discharge circuit 12C includes nMOS transistors N3, N4, N5. The drain of the nMOS transistor N3 is connected to the source (or drain) of the nMOS transistor N5 and the bit line BL. The drain of the nMOS transistor N4 is connected to the drain (or source) of the nMOS transistor N5 and the bit line BLB. The ground potential GND ("L") is supplied to the sources of the nMOS transistors N3, N4.

The discharge signal DCC is supplied to the gates of the nMOS transistors N3, N4, N5 from the AND circuit AN1. The discharge signal DCC is a signal that sets the discharge circuit 12C to the operating state or the non-operating state. When the discharge signal DCC is "H", the discharge circuit 12C is set to the operating state to discharge the bit lines BL, BLB to "L". When the discharge signal DCC is "L", the discharge circuit 12C is set to the non-operating state and does not discharge the bit lines BL, BLB.

The discharge circuit 12D includes nMOS transistors N6, N7, N8. The drain of the nMOS transistor N6 is connected to the source (or drain) of the nMOS transistor N8 and the bit line BL. The drain of the nMOS transistor N7 is connected to the drain (or source) of the nMOS transistor N8 and the bit line BLB. The ground potential GND ("L") is supplied to the sources of the nMOS transistors N6, N7.

The discharge signal DCD is supplied to the gates of the nMOS transistors N6, N7, N8 from the amplifier circuit OA1. The discharge signal DCD is a signal that sets the discharge circuit 12D to the operating state or the non-operating state. When the discharge signal DCD is "H", the discharge circuit 12D is set to the operating state to discharge the bit lines BL, BLB to "L". When the discharge signal DCD is "L", the discharge circuit 12D is set to the non-operating state and does not discharge the bit lines BL, BLB.

In the present modification, the discharge circuit 12C is used for the read operation or the write operation and the discharge circuit 12D is used while in the data holding state. The present embodiment can also be applied to the modification configured as described above.

The thickness of the gate insulating film of each of the nMOS transistors N3, N4, N5 included in the discharge circuit 12C is denoted as a "third gate film thickness" and the thickness of the gate insulating film of each of the nMOS transistors N6, N7, N8 included in the discharge circuit 12D is denoted as a "fourth gate film thickness". The channel width of each of the nMOS transistors N3, N4, N5 included in the discharge circuit 12C is denoted as a "third channel width" and the channel width of each of the nMOS transistors N6, N7, N8 included in the discharge circuit 12D is denoted as a "fourth channel width".

In the present modification, the third gate film thickness of each of the nMOS transistors N3, N4, N5 in the discharge circuit 12C is thin and the fourth gate film thickness of each of the nMOS transistors N6, N7, N8 in the discharge circuit 12D is thicker than the third gate film thickness. Accordingly, a gate leak current arising in the nMOS transistors N6, N7, N8 in the discharge circuit 12D can be made smaller than a gate leak current arising in the nMOS transistors N3, N4, N5 in the discharge circuit 12C. Incidentally, the gate insulating film is formed of, for example, silicon oxide, silicon nitride, or a film having a high dielectric constant (High-k film).

The fourth channel width of each of the nMOS transistors N6, N7, N8 in the discharge circuit 12D is smaller than the third channel width of each of the nMOS transistors N3, N4, N5 in the discharge circuit 12C.

Further, an example in which each of the two discharge circuits 12C, 12D includes three nMOS transistors is shown. However, the present modification is not limited to such an example and each of the discharge circuits 12C, 12D may include two nMOS transistors. In this case, the nMOS transistors N5, N8 may be deleted from the discharge circuits 12C, 12D shown in FIG. 12.

According to the above embodiment and the modification, the semiconductor memory device capable of reducing the leak current in the precharge circuit while in the data holding state can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first MOS transistor in which a first voltage is supplied to one of a source and a drain, the first MOS transistor having a first conductive type;
a second MOS transistor whose gate is connected to the other of the source and the drain of the first MOS transistor, the second MOS transistor having the first conductive type, wherein the first voltage is supplied to one of a source and a drain of the second MOS transistor and the other of the source and the drain of the second MOS transistor is connected to a gate of the first MOS transistor;
a third MOS transistor whose source and drain are connected to between the other of the source and the drain of the first MOS transistor and a first bit line, the third MOS transistor having a second conductive type, wherein a gate of the third MOS transistor is connected to a word line;
a fourth MOS transistor whose source and drain are connected to between the other of the source and the drain of the second MOS transistor and a second bit line, the fourth MOS transistor having the second conductive type, wherein a gate of the fourth MOS transistor is connected to the word line;
a first precharge circuit including a fifth MOS transistor and a sixth MOS transistor to supply a second voltage to the first and second bit lines in a precharge period during at least one of a read operation and a write operation, the fifth and sixth MOS transistors transistor having the second conductive type, and
a second precharge circuit including a seventh MOS transistor and an eighth MOS transistor to supply the second voltage to the first and second bit lines while in a data holding state.

2. The semiconductor memory device according to claim 1, wherein a thickness of a gate insulating film of the seventh and eighth MOS transistors is thicker than that of a gate insulating film of the fifth and sixth MOS transistors.

3. The semiconductor memory device according to claim 1, wherein a channel width of the seventh and eighth MOS transistors is smaller than that of the fifth and sixth MOS transistors.

4. The semiconductor memory device according to claim 1, wherein the second precharge circuit supplies the second voltage to the first and second bit lines in the precharge period during at least one of the read operation and the write operation, further with the first precharge circuit.

5. The semiconductor memory device according to claim 2, further comprising an input/output circuit that inputs/outputs at least one of data and a signal,
wherein the input/output circuit includes a ninth MOS transistor and a thickness of the gate insulating film of the seventh and eighth MOS transistors is identical to that of a gate insulating film of the ninth MOS transistor.

6. The semiconductor memory device according to claim 1, wherein thicknesses of gate insulating films of the first, second, third and fourth MOS transistors are thicker than that of a gate insulating film of the fifth and sixth MOS transistors.

7. The semiconductor memory device according to claim 1, wherein the first precharge circuit is set to a non-operating state and the second precharge circuit is set to an operating state while in the data holding state.

8. The semiconductor memory device according to claim 1, wherein the first precharge circuit is set to an operating state and the second precharge circuit is set to a non-operating state during at least one of the read operation and the write operation.

9. The semiconductor memory device according to claim 1, wherein the first and second MOS transistors are n-channel MOS transistors and the third and fourth MOS transistors are p-channel MOS transistors.

10. The semiconductor memory device according to claim 1, wherein the first and second MOS transistors are p-channel MOS transistors and the third and fourth MOS transistors are n-channel MOS transistors.

11. A semiconductor memory device comprising:
a first n-channel MOS transistor in which a first voltage is supplied to one of a source and a drain;
a second n-channel MOS transistor whose gate is connected to the other of the source and the drain of the first n-channel MOS transistor, wherein the first voltage is supplied to one of a source and a drain of the second n-channel MOS transistor and the other of the source and the drain of the second n-channel MOS transistor is connected to a gate of the first n-channel MOS transistor;
a first p-channel MOS transistor in which one of a source and a drain is connected to the other of the first n-channel MOS transistor;
a first bit line connected to the other of the source and the drain of the first p-channel MOS transistor;
a second p-channel MOS transistor in which one of a source and a drain is connected to the other of the second n-channel MOS transistor;
a second bit line connected to the other of the source and the drain of the second p-channel MOS transistor;
a word line connected to the gates of the first and second p-channel MOS transistors;
a first precharge circuit including a third p-channel MOS transistor and a fourth p-channel MOS transistor to supply a second voltage to the first and second bit lines in a precharge period during at least one of a read operation and a write operation; and
a second precharge circuit including a fifth p-channel MOS transistor and a sixth p-channel MOS transistor to supply the second voltage to the first and second bit lines while in a data holding state.

12. The semiconductor memory device according to claim 11, wherein a thickness of a gate insulating film of the fifth and sixth p-channel MOS transistors is thicker than that of a gate insulating film of the third and fourth p-channel MOS transistors.

13. The semiconductor memory device according to claim 11, wherein a channel width of the fifth and sixth p-channel MOS transistors is smaller than that of the third and fourth p-channel MOS transistors.

14. The semiconductor memory device according to claim 11, wherein the first precharge circuit is set to a non-operating state and the second precharge circuit is set to an operating state while in the data holding state.

15. The semiconductor memory device according to claim 11, wherein the first precharge circuit is set to an operating state and the second precharge circuit is set to a non-operating state during at least one of the read operation and the write operation.

16. A semiconductor memory device comprising:
a first p-channel MOS transistor in which a first voltage is supplied to one of a source and a drain;
a second p-channel MOS transistor whose gate is connected to the other of the source and the drain of the first p-channel MOS transistor, wherein the first voltage is supplied to one of a source and a drain of the second p-channel MOS transistor and the other of the source and the drain of the second p-channel MOS transistor is connected to a gate of the first p-channel MOS transistor;
a first n-channel MOS transistor in which one of a source and a drain is connected to the other of the first p-channel MOS transistor;
a first bit line connected to the other of the source and the drain of the first n-channel MOS transistor;
a second n-channel MOS transistor in which one of a source and a drain is connected to the other of the second p-channel MOS transistor;
a second bit line connected to the other of the source and the drain of the second n-channel MOS transistor;
a word line connected to the gates of the first and second n-channel MOS transistors;
a first discharge circuit including a third n-channel MOS transistor and a fourth n-channel MOS transistor to supply a second voltage to the first and second bit lines in a discharge period during at least one of a read operation and a write operation; and
a second discharge circuit including a fifth n-channel MOS transistor and a sixth n-channel MOS transistor to supply the second voltage to the first and second bit lines while in a data holding state.

17. The semiconductor memory device according to claim 16, wherein a thickness of a gate insulating film of the fifth and sixth n-channel MOS transistors is thicker than that of a gate insulating film of the third and fourth n-channel MOS transistors.

18. The semiconductor memory device according to claim 16, wherein a channel width of the fifth and sixth n-channel MOS transistors is smaller than that of the third and fourth n-channel MOS transistors.

19. The semiconductor memory device according to claim 16, wherein the first discharge circuit is set to a non-operating state and the second discharge circuit is set to an operating state while in the data holding state.

20. The semiconductor memory device according to claim 16, wherein the first discharge circuit is set to an operating state and the second discharge circuit is set to a non-operating state during at least one of the read operation and the write operation.

* * * * *